(12) United States Patent
Maeda et al.

(10) Patent No.: US 10,069,281 B2
(45) Date of Patent: Sep. 4, 2018

(54) LASER DIODE AND METHOD OF MANUFACTURING LASER DIODE

(71) Applicant: Mitsubishi Electric Corporation, Tokyo (JP)

(72) Inventors: Kazuhiro Maeda, Tokyo (JP); Masafumi Minami, Tokyo (JP); Naoki Nakamura, Tokyo (JP); Daisuke Morita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/844,686

(22) Filed: Dec. 18, 2017

(65) Prior Publication Data

US 2018/0109077 A1    Apr. 19, 2018

Related U.S. Application Data

(62) Division of application No. 15/407,530, filed on Jan. 17, 2017, now Pat. No. 9,923,336.

(30) Foreign Application Priority Data

Jun. 9, 2016  (JP) ................................. 2016-115335

(51) Int. Cl.
*H01S 5/00*          (2006.01)
*H01S 5/223*         (2006.01)
(Continued)

(52) U.S. Cl.
CPC .......... *H01S 5/2238* (2013.01); *H01S 5/2045* (2013.01); *H01S 5/223* (2013.01);
(Continued)

(58) Field of Classification Search
CPC ...... H01S 5/2238; H01S 5/227; H01S 5/2277; H01S 5/2213; H01S 5/2205; H01S 5/2045; H01S 5/223
See application file for complete search history.

(56) References Cited

U.S. PATENT DOCUMENTS

2010/0111129 A1    5/2010  Nakashima et al.
2011/0075693 A1    3/2011  Kuramochi et al.
(Continued)

FOREIGN PATENT DOCUMENTS

CN    106684706 A    5/2017
JP    2006-066411 A   3/2006
JP    2007-173392 A   7/2007

*Primary Examiner* — Yuanda Zhang
(74) *Attorney, Agent, or Firm* — Studebaker & Brackett PC

(57) ABSTRACT

A laser diode includes a ridge portion, channel portions located adjacent to the ridge portion such that the ridge portion is sandwiched, the channel portions being shorter in height than the ridge portion, terrace portions adjacent to opposite sides of the respective channel portions from the ridge portion and longer in height than the channel portions, supporting portions provided over the respective channel portions, separated from side surfaces of the ridge portion or side surfaces of terrace portions or both, and made of resin, a ceiling portion including first portions provided over the supporting portions and second portions continuous with the first portions and located over the respective channel portions with hollow portions interposed therebetween, the ceiling portion being made of resin, and a metal layer provided over the ceiling portion and connected to an upper surface of the ridge portion.

5 Claims, 19 Drawing Sheets

(51) Int. Cl.
*H01S 5/227* (2006.01)
*H01S 5/22* (2006.01)
*H01S 5/20* (2006.01)

(52) U.S. Cl.
CPC ............ *H01S 5/2205* (2013.01); *H01S 5/227* (2013.01); *H01S 5/2213* (2013.01); *H01S 5/2277* (2013.01)

(56) References Cited

U.S. PATENT DOCUMENTS

| | | | |
|---|---|---|---|
| 2013/0182733 A1* | 7/2013 | Yoneda | H01S 5/22 372/44.01 |
| 2015/0357794 A1 | 12/2015 | Tsuji | |
| 2016/0294160 A1 | 10/2016 | Hashimoto | |
| 2017/0133820 A1 | 5/2017 | Minami et al. | |

* cited by examiner

LASER DIODE AND METHOD OF MANUFACTURING LASER DIODE

CROSS-REFERENCE TO RELATED APPLICATIONS

This application is a Divisional Application of U.S. patent application Ser. No. 15/407,530 filed Jan. 17, 2017, which claims benefit of Japanese Patent Application No. 2016-115335 filed Jun. 9, 2016, the entire contents of which are incorporated herein by reference.

BACKGROUND OF THE INVENTION

Field of the Invention

The present invention relates to a laser diode which, for example, operates fast, and a method of manufacturing the laser diode.

Background Art

Japanese laid-open patent publication No. 2006-066411 discloses a nitride semiconductor laser diode including a ridge stripe provided in a semiconductor layer, groove portions provided along both sides of the ridge stripe, and unfilled portions between a metal layer formed over the groove portions and bottom portions of the groove portions. The metal layer is supported by the ridge stripe and hill portions provided outside the groove portions.

Japanese laid-open patent publication No. 2007-173392 discloses a technique in which hollows are formed along both sides of a mesa stripe. An insulating portion and an electrode portion provided on the insulating portion are formed above the hollows.

The laser diode of Japanese laid-open patent publication No. 2006-066411 has the problem that because of the proximity of the metal layer over the unfilled portions to the semiconductor layer, parasitic capacitance influences characteristics of the laser diode. The laser diode of Japanese laid-open patent publication No. 2007-173392 has the possibility that the insulating portion may sag into the hollows.

SUMMARY OF THE INVENTION

The present invention has been accomplished to solve the above-described problems. An object of the present invention is to provide a laser diode in which hollow portions provided along both sides of a mesa stripe can be ensured while reduced parasitic capacitance is realized, and a method of manufacturing the laser diode.

The features and advantages of the present invention may be summarized as follows.

According to one aspect of the present invention, a laser diode includes a ridge portion raised in a stripe shape, channel portions located adjacent to the ridge portion such that the ridge portion is sandwiched therebetween, the channel portions being shorter in height than the ridge portion, terrace portions adjacent to opposite sides of the respective channel portions from the ridge portion and longer in height than the channel portions, supporting portions provided over the respective channel portions, separated from respective adjacent side surfaces of the ridge portion or side surfaces of the respective adjacent terrace portions or both, and made of resin, a ceiling portion including first portions provided over the respective supporting portions and second portions continuous with the respective first portions and located over the respective channel portions with hollow portions interposed therebetween, the ceiling portion being made of resin, and a metal layer provided over the ceiling portion and connected to an upper surface of the ridge portion.

According to another aspect of the present invention, a method of manufacturing a laser diode includes the steps of forming resin in portions of channel portions of a laser structure to form hollow portions sealed with the laser structure and the resin, the laser structure including a ridge portion raised in a stripe shape, the channel portions having the ridge portion sandwiched therebetween and being shorter in height than the ridge portion, and terrace portions adjacent to opposite sides of the respective channel portion from the ridge portion and longer in height than the channel portions, forming a metal layer contacting an upper surface of the ridge portion over the resin, and patterning the metal layer using resist.

According to still another aspect of the present invention, a method of manufacturing a laser diode includes the steps of forming supporting portions made of resin in portions of channel portions of a laser structure, the laser structure including a ridge portion raised in a stripe shape, the channel portions having the ridge portion sandwiched therebetween and being shorter in height than the ridge portion, and terrace portions adjacent to opposite sides of the respective channel portion from the ridge portion and longer in height than the channel portions, the supporting portions being separated from respective adjacent side surfaces of the ridge portion or side surfaces of the respective adjacent terrace portions or both, forming a ceiling portion supported by the supporting portion and the ridge portion and made of resin by any one of laminating and STP to form hollow portions between the ceiling portion and the channel portions, and forming a metal layer contacting an upper surface of the ridge portion over the ceiling portion.

Other and further objects, features and advantages of the invention will appear more fully from the following description.

BRIEF DESCRIPTION OF THE DRAWINGS

FIG. 2 is a cross-sectional view showing a laser structure and the like;

FIG. 3 is a cross-sectional view showing the precursor and the like;

FIG. 4 is a cross-sectional view showing the supporting portions and the like;

FIG. 5 is a plan view showing the supporting portions and the like;

FIG. 6 is a cross-sectional view showing the supporting portions and the like;

FIG. 7 is a cross-sectional view showing the insulating film and the like;

FIG. 8 is a cross-sectional view showing the ceiling portion and the like;

FIG. 10 is a cross-sectional view showing the insulating film and the like;

FIG. 11 is a plan view showing the metal layer and the like;

FIG. 14 is a cross-sectional view of supporting portions and the like;

FIG. 15 is a cross-sectional view of supporting portions and the like;

FIG. 16 is a cross-sectional view of an insulating film and the like;

FIG. 17 is a cross-sectional view of the ceiling portion having wide opening and the like;

FIG. 18 is a cross-sectional view of an insulating film and the like;

FIG. 20 is a cross-sectional view of supporting portions and the like;

FIG. 21 is a cross-sectional view of supporting portions and the like;

FIG. 22 is a plan view of supporting portions and the like;

FIG. 23 is a cross-sectional view of insulating portion and the like;

FIG. 24 is a cross-sectional view of the ceiling portion and the like;

FIG. 26 is a plan view of ceiling portion and the like;

FIG. 27 is a plan view showing the metal layer and the like;

FIG. 28 is a plan view showing the supporting portions formed to be small and the like;

FIG. 29 is a plan view showing the ceiling portion formed to be small and the like;

FIG. 30 is a plan view showing the metal layer formed to be small and the like;

FIG. 36 is a plan view of ceiling portion and the like; and

FIG. 37 is a plan view of metal layer and the like.

DETAILED DESCRIPTION OF THE PREFERRED EMBODIMENTS

Laser diodes and laser diode manufacturing methods according to embodiments of the present invention will be described with reference to the drawings. The same or corresponding components will be denoted by the same reference signs, and the repetition of explanation thereof may be omitted.

Embodiment 1

Figure 1:
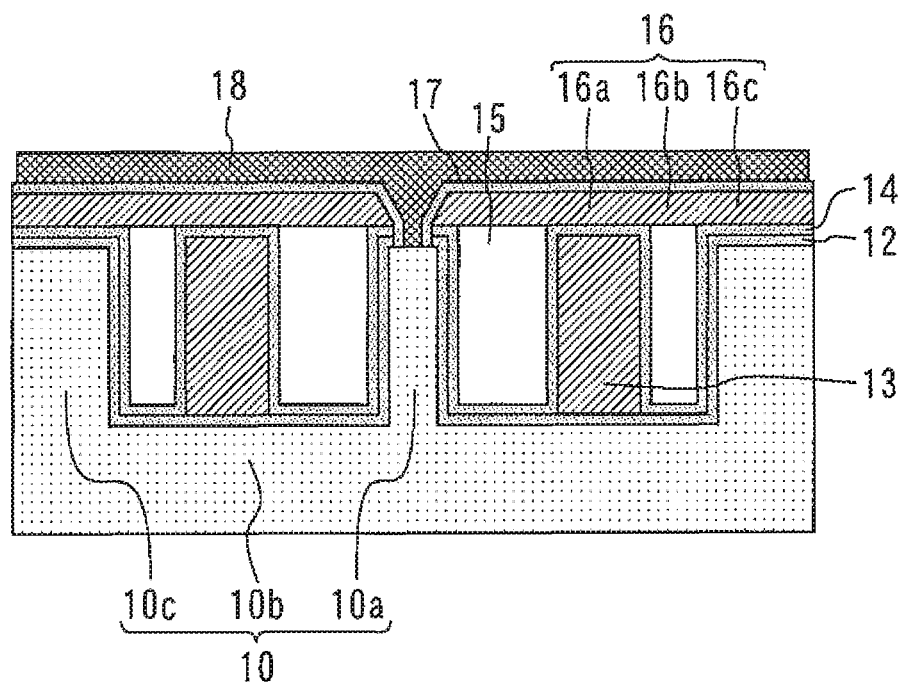
FIG. 1 is a cross-sectional view of a laser diode according to embodiment 1.

FIG. 1 is a cross-sectional view of a laser diode according to embodiment 1. This laser diode includes a ridge portion 10a raised in a stripe shape. Channel portions 10b are formed along both sides of the ridge portion 10a to be adjacent to the ridge portion 10a such that the ridge portion 10a is sandwiched therebetween. The channel portions 10b are shorter in height than the ridge portion 10a. On the opposite side of each channel portion 10b from the ridge portion 10a, a terrace portion 10c is formed adjacent to the channel portion 10b. The terrace portions 10c are longer in height than the channel portions 10b. The terrace portions 10c and the ridge portion 10a have approximately equal heights. The ridge portion 10a, the channel portions 10b, and the terrace portions 10c are collectively referred to as a laser structure 10. The laser structure 10 is made of semiconductors.

An upper surface of the laser structure 10 is covered with an insulating film 12. A supporting portion 13 made of resin is provided over each channel portion 10b. The supporting portion 13 is provided to be separated from both an adjacent side surface of the ridge portion 10a and a side surface of the adjacent terrace portion 10c. Hollow portions 15 are formed on both sides of the supporting portion 13. The supporting portions 13 and the insulating film 12 are covered with an insulating film 14.

A ceiling portion 16 made of resin is provided over the laser structure 10 and the supporting portions 13. The ceiling portion 16 includes a first portion 16a provided over each supporting portion 13, second portions 16b continuous with the first portion 16a and located over the channel portion 10b with the hollow portions 15 interposed therebetween, and a third portion 16c provided over each terrace portion 10c. The first portions 16a, the second portions 16b, and the third portions 16c are integrally formed.

An insulating film 17 is formed on the ceiling portion 16. A metal layer 18 is provided over the ceiling portion 16 with the insulating film 17 interposed therebetween. The insulating films 12, 14, and 17 and the ceiling portion 16 have openings over the ridge portion 10a. Filling these openings with the metal layer 18 connects the metal layer 18 to an upper surface of the ridge portion 10a.

A laser diode manufacturing method according to embodiment 1 of the present invention will be described. A first step will be described with reference to FIG. 2, which is a cross-sectional view showing a laser structure and the like. In this step, the laser structure 10 is covered with the insulating film 12. After that, an opening on the ridge portion 10a is formed in the insulating film 12.

Figure 3:
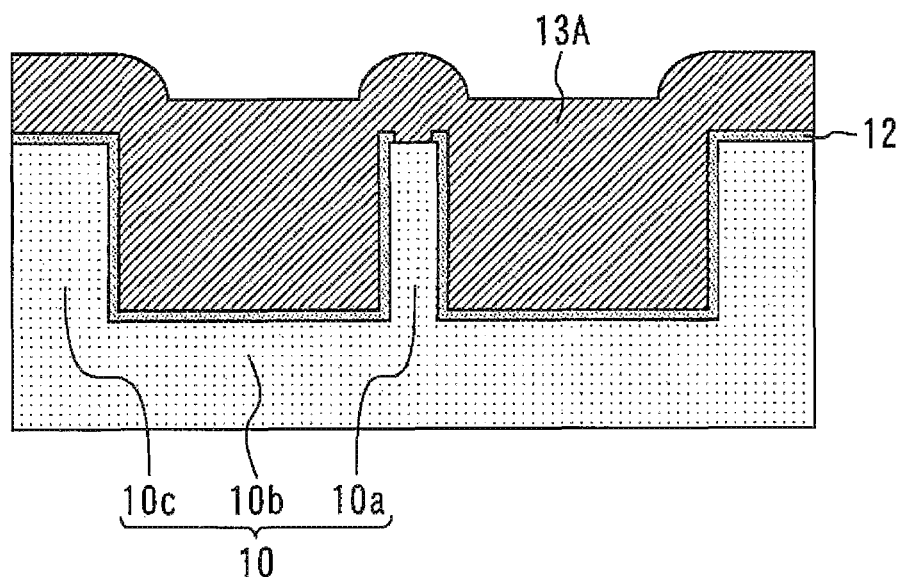

Subsequently, a precursor made of photosensitive resin is applied to the laser structure 10. FIG. 3, which is a cross-sectional view, shows the precursor 13A. The precursor 13A fills grooves formed by the ridge portion 10a, the channel portions 10b, and the terrace portions 10c.

Figure 4:
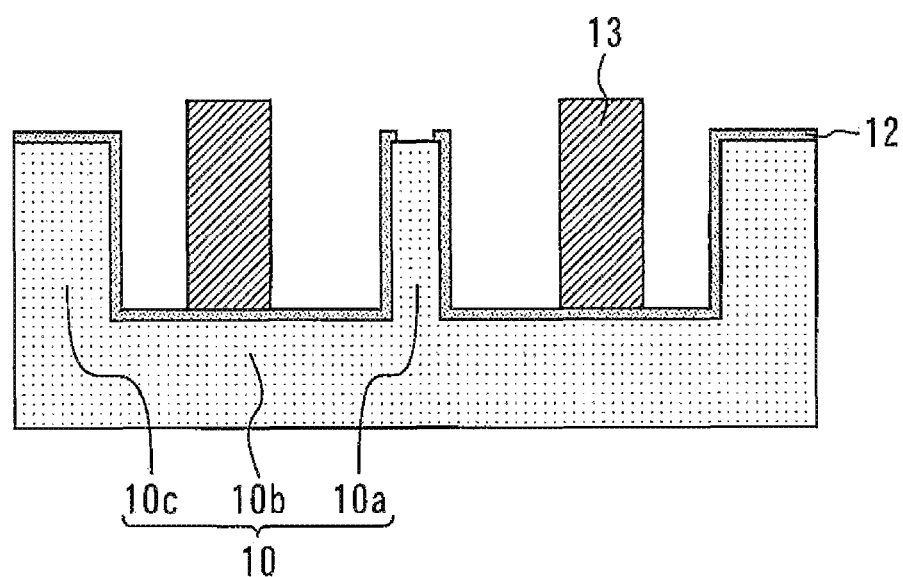
Figure 5:
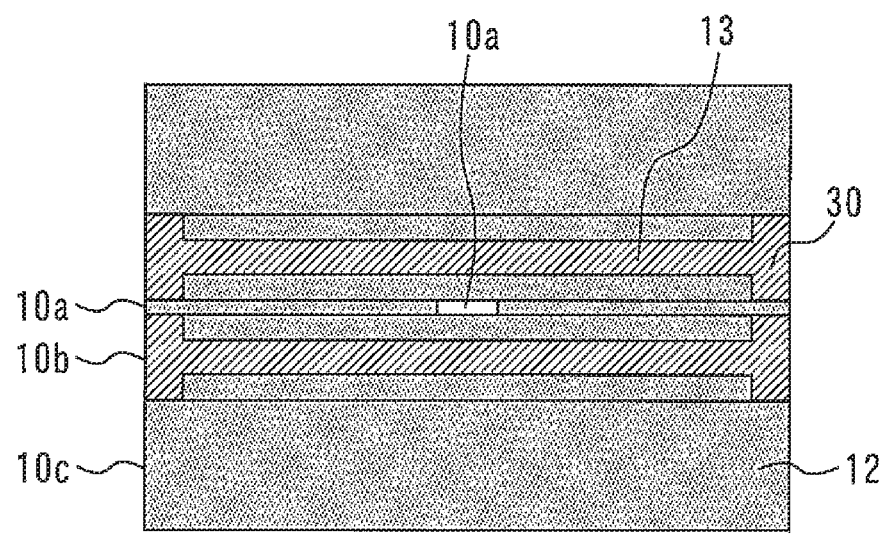

Then, the precursor 13A is patterned by exposure and development. FIG. 4, which is a cross-sectional view, shows the supporting portions 13 obtained by patterning the precursor. FIG. 5 is a plan view showing the supporting portions 13 and the like. Patterning the precursor forms the supporting portions 13 separated from the ridge portion 10a and the terrace portions 10c and buried portions 30 continuous with the supporting portions 13. The supporting portions 13 are portions extending parallel to the ridge portion 10a. The buried portions 30 are provided over the channel portions 10b and connected to opposite ends of the respective supporting portions 13 in planar view. Each buried portion 30 contacts both the adjacent side surface of the ridge portion 10a and the side surface of the adjacent terrace portion 10c. Thus, the buried portions 30 fill portions of the grooves formed along both sides of the ridge portion 10a. FIG. 5 shows four buried portions 30 such as described above. The buried portions 30 are provided along end faces of the laser diode. A right-side end face of the structure shown in FIG. 5 is a front end face, and a left-side end face thereof is a rear end face.

Figure 6:
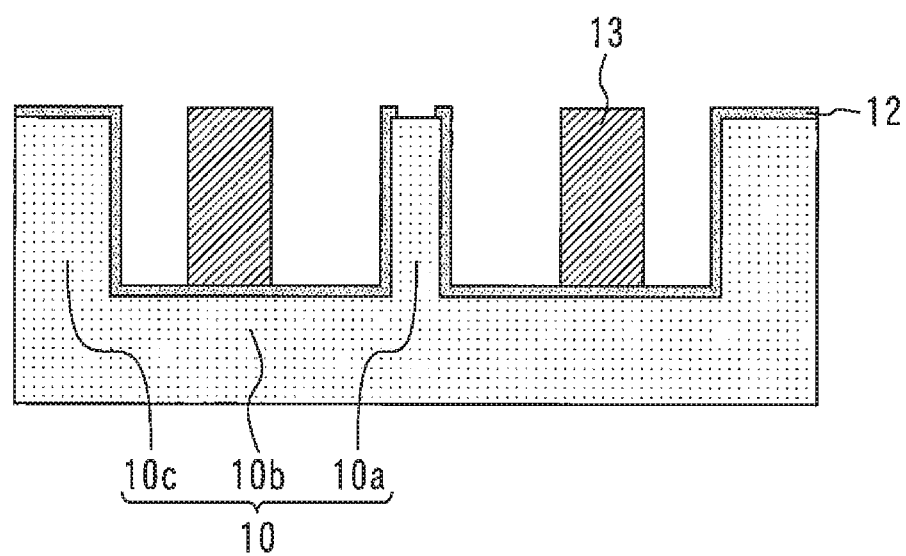

After that, curing is performed to harden the supporting portions 13 made of resin. FIG. 6, which is a cross-sectional view, shows the supporting portions 13 after curing. The thickness of the aforementioned precursor 13A or the temperature and time of curing are adjusted so that the supporting portions 13 and the buried portions 30 after shrinkage and the ridge portion 10a may have approximately equal heights.

Figure 7:
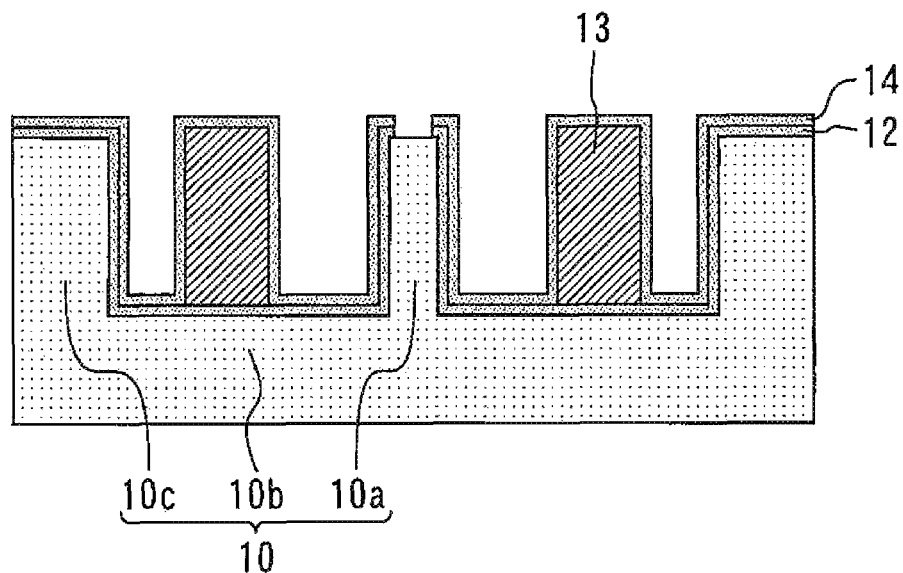

Subsequently, an insulating film is formed on the supporting portions 13, the buried portions 30, and the laser structure 10. FIG. 7, which is a cross-sectional view, shows a state in which the insulating film 14 is formed on the supporting portions 13, the buried portions 30, and the insulating film 12. The insulating film 14 has an opening over the ridge portion 10a.

Figure 8:
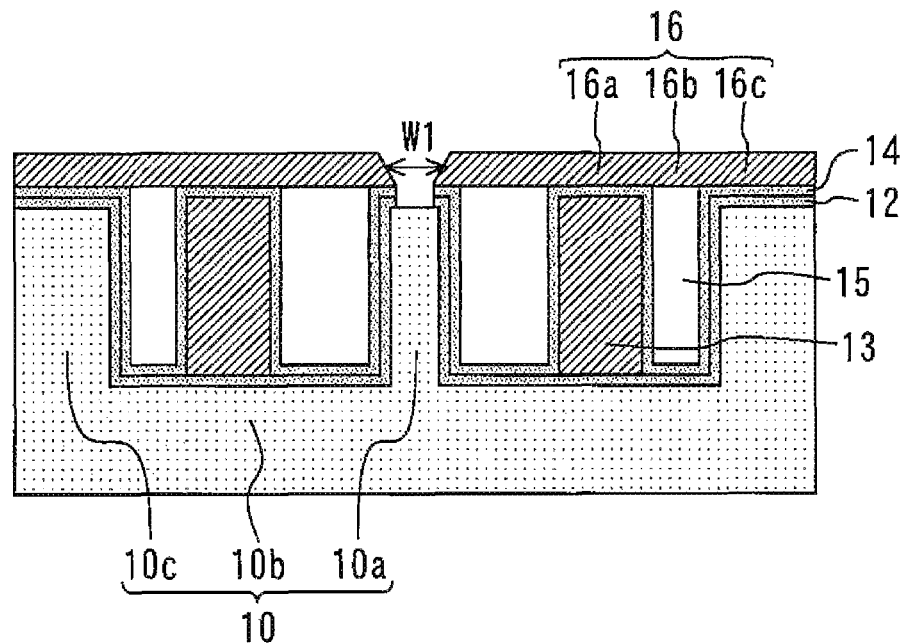

Then, a ceiling portion is formed. FIG. 8, which is a cross-sectional view, shows the ceiling portion 16. The ceiling portion 16 is formed by laminating or STP (Spin Coating Film Transfer and Hot-pressing). Specifically, a sheet film having a photosensitive resin film formed thereon is joined to upper surfaces of the ridge portion 10a, the supporting portions 13, and the terrace portions 10c. After that, the sheet film is removed to leave the ceiling portion 16 made of a photosensitive resin film. The ceiling portion 16 is supported by the supporting portions 13, the ridge portion 10a, and the terrace portions 10c. Forming the ceiling portion 16 causes the hollow portions 15 to be formed between the ceiling portion 16 and the channel portions 10b.

Figure 9:
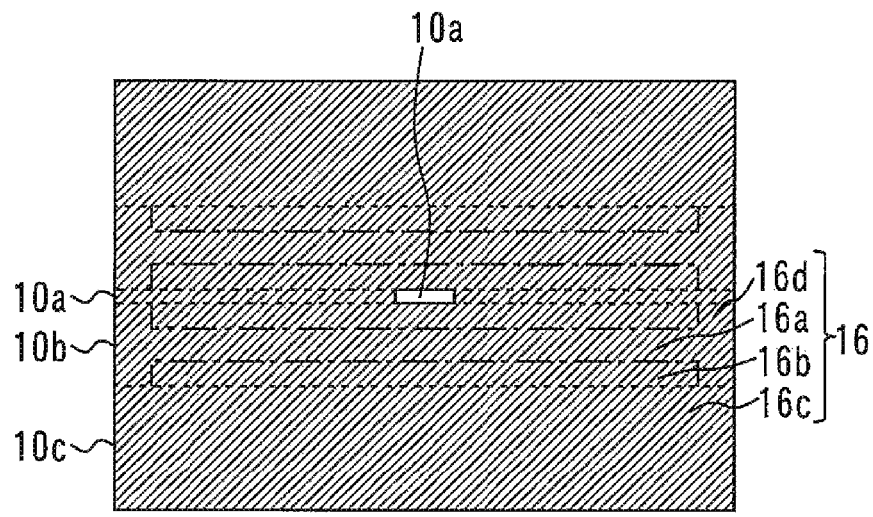
FIG. 9 is a plan view showing the ceiling portion.

FIG. 9 is a plan view of the laser diode after the formation of the ceiling portion 16. In FIG. 9, broken lines indicate boundaries between the ridge portion 10a and each channel portion 10b and boundaries between each channel portion 10b and the corresponding terrace portion 10c. Dashed dotted lines indicate outlines of the supporting portions 13 and the buried portions 30. The ceiling portion 16 includes the first portions 16a, the second portions 16b, and the third portions 16c and further includes fourth portions 16d provided over the buried portions 30 and continuous with the first portions 16a or the second portions 16b. The ceiling portion is patterned by exposure and development to form an opening over the ridge portion 10a. After that, the ceiling portion 16 is hardened by curing. Forming the ceiling portion 16 causes the hollow portions 15 to be sealed with the buried portions 30, the laser structure 10, and the ceiling portion 16. Each hollow portion 15 is an enclosed space, and no matter enters the hollow portions 15 from the outside.

Figure 10:
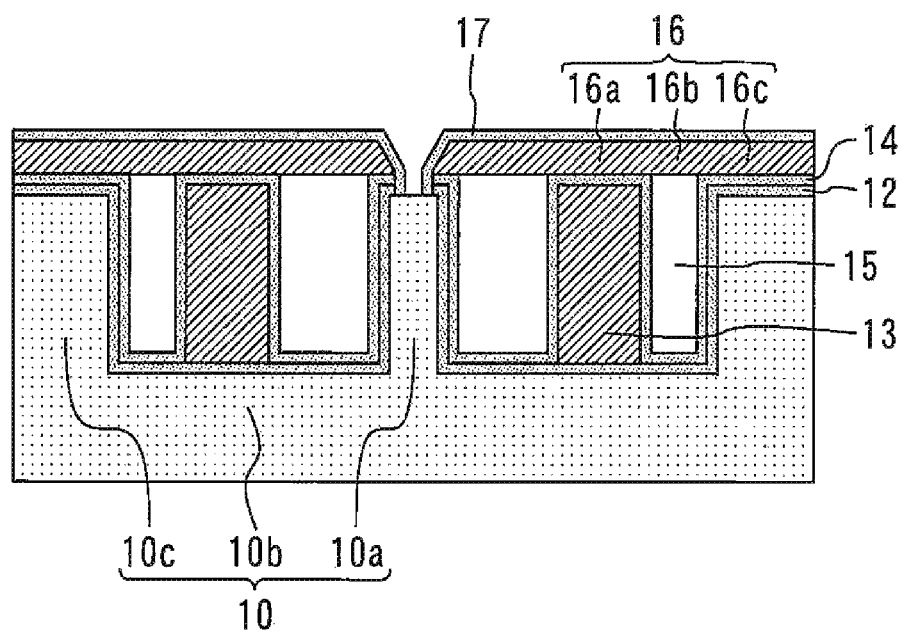

Subsequently, an insulating film is formed. FIG. 10, which is a cross-sectional view, shows a state in which the insulating film 17 is formed on the ceiling portion 16. The insulating film 17 has an opening over the ridge portion 10a. Then, the metal layer 18 is formed over the ceiling portion 16 with the insulating film 17 interposed therebetween. A cross-sectional view of the laser diode having the metal layer 18 formed therein is FIG. 1. The metal layer 18 fills the openings formed over the ridge portion 10a to contact the upper surface of the ridge portion 10a.

Figure 11:
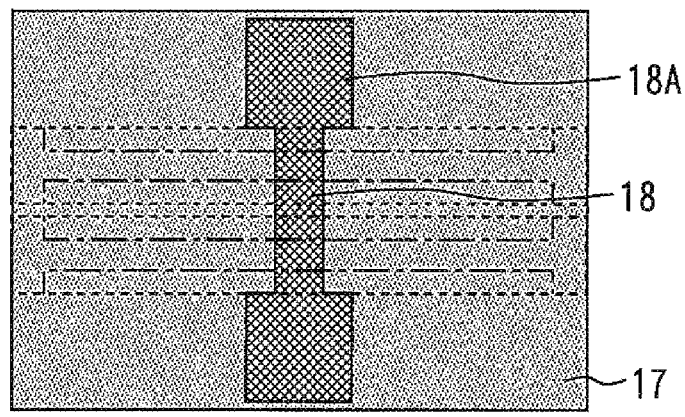

The metal layer 18 is patterned in a predetermined shape so that the metal layer 18 can be used as metal wiring. Specifically, resist is formed on the insulating film 17 in a state in which the hollow portions 15 are sealed with the ceiling portion 16, the resist is patterned, and part of the metal layer 18 is etched using the resist as a mask. Thus, the patterned metal layer 18 shown in FIG. 11, which is a plan view, is obtained. Since the hollow portions 15 are sealed with the ceiling portion 16, the buried portions 30, and the laser structure 10 when resist is used, resist does not enter the hollow portions 15 to generate resist residue there. The completed metal layer 18 includes pads 18A over the terrace portions. Each pad 18A is a portion to which a wire is connected by wire bonding.

The laser diode according to embodiment 1 of the present invention eliminates the problem that the ceiling portion 16 sags into the hollow portions 15. This will be described below.

Jpn. J. Appl. Phys. Vol. 42 (2003) pp. 2462-2467 contains a description on the relationship between the thickness of a resin film formed by STP and the size of a hollow portion. This document describes that the width of a hollow portion should be 20 μm or less and 100 μm or less for resin films having thicknesses of approximately 2 μm and approximately 9 μm, respectively, in order to maintain the hollow portion (p. 2465, FIG. 10). However, a general semiconductor laser diode has a channel portion width of approximately 10 to 50 μm and a resonator length of approximately 200 μm. If the film thickness of a ceiling portion is 1 to 10 μm, it is difficult to form a hollow portion in the above-described general semiconductor laser diode. In other words, there has been the problem that in the case where a ceiling portion is formed in the above-described general-size semiconductor laser diode, the ceiling portion sags into the hollow portion because of insufficient strength of the ceiling portion.

In view of this, in the laser diode according to embodiment 1 of the present invention, the supporting portions 13 are provided in the channel portions 10b, and the supporting portions 13 support the ceiling portion 16. Accordingly, the ceiling portion 16 can be prevented from sagging into the hollow portions 15.

In the laser diode according to embodiment 1 of the present invention, the capacitance thereof can be made small. This will be described below. A capacitance C is expressed by the equation $C=\varepsilon_0\varepsilon_r\cdot S/d$ ($\varepsilon_0$: vacuum permittivity, $\varepsilon_r$: relative permittivity, S: area, d: distance). Since the metal layer 18 of the laser diode according to embodiment 1 of the present invention is provided over the hollow portions 15, the metal layer 18 can be located at a longer distance from the laser structure 10 than in the case where the metal layer 18 is provided along the side surfaces of the ridge portion 10a, the upper surfaces of the channel portions 10b, and the side surfaces of the terrace portions 10c. Accordingly, the capacitance can be made small.

Figure 12:
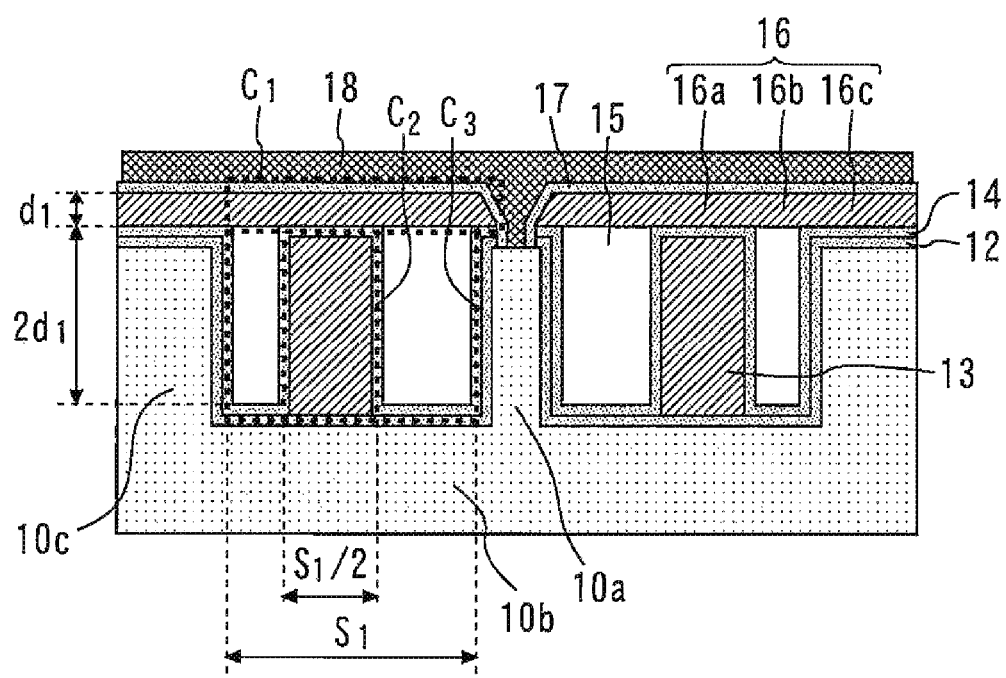
FIG. 12 is a cross-sectional view of a laser diode.

A comparison between the case where grooves on both sides of a ridge are filled with resin and the case where hollow portions are formed is made with reference to FIG. 12. The hollow portions 15 contain air, and have a relative permittivity of 1. The supporting portions 13 and the ceiling portion 16, which are resin films, are assumed to have a relative permittivity of 3. The thickness of the ceiling portion 16 is denoted by $d_1$, and the height of each hollow portion 15 is denoted by $2d_1$. The area of each supporting portion 13 is denoted by $S_1/2$, which is half of the area $S_1$ of each channel portion 10b. Thus, half of the volume of the grooves on both sides of the ridge portion 10a is occupied by the supporting portions 13.

If the grooves on both sides of the ridge portion 10a are filled with resin, the capacitance C is expressed as follows:

$$C=\varepsilon_0\varepsilon_r S_1/(d_1+2d_1)=\varepsilon_0 S_1/d_1.$$

The capacitance for the case where the hollow portions 15 are formed is found. As shown in FIG. 12, the capacitance of the ceiling portion 16 is denoted by $C_1$, the capacitance of the supporting portion 13 is denoted by $C_2$, and the capacitance of the hollow portions 15 is denoted by $C_3$. In FIG. 12, portions corresponding to $C_1$, $C_2$, and $C_3$ are indicated by broken lines.

These capacitances are expressed as follows:

$$C_1=\varepsilon_0\varepsilon_r S_1/d_1=\varepsilon_0\cdot 3\cdot S_1/d_1=3\varepsilon_0 S_1/d_1,$$

$$C_2=\varepsilon_0\varepsilon_r S_1/2/2d_1=\varepsilon_0\cdot 3\cdot S_1/d_1=3\varepsilon_0 S_1/d_1, \text{ and}$$

$$C_3=\varepsilon_0\varepsilon_r S_1/2/2d_1=\varepsilon_0\cdot 1\cdot S_1/d_1=\varepsilon_0 S_1/d_1.$$

Since the ceiling portion 16 is in series and the supporting portion 13 and the hollow portions 15 are in parallel as shown in FIG. 12, an equation expressing the whole capacitance C for the case where the hollow portions 15 are formed is as follows:

$$1/C = 1/C_1 + 1/(C_2 + C_3).$$

Accordingly, $$C = C_1 \cdot (C_2 + C_3)/(C_1 + C_2 + C_3) = \tfrac{3}{4} \cdot \varepsilon_0 S_1 / d_1.$$

From the above description, it can be seen that the capacitance can be made smaller in the case where the hollow portions 15 are formed than in the case where the grooves on both sides of the ridge portion 10a are filled with resin. Reducing the capacitance makes it possible to provide a laser diode favorable to fast operation.

In the laser diode according to embodiment 1 of the present invention, parasitic capacitance can be made small. This will be described below. In the case where an interconnection extended from a ridge contacts a laser structure with an insulating film interposed therebetween, parasitic capacitance becomes large because the permittivity of the insulating film is large. To prevent parasitic capacitance from becoming large, the area of metal wiring including pad portions has needed to be made small to make parasitic capacitance small. In the case where pad portions are small, high wire bonding accuracy is needed in an assembly process, and production is not stable.

However, in embodiment 1 of the present invention, providing the hollow portions 15 causes the metal layer 18 and the laser structure 10 to be separated. Also, since the ceiling portion 16 and the supporting portions 13 made of resin having low permittivities, not insulating films having high permittivities, exist between the metal layer 18 and the laser structure 10, parasitic capacitance can be made small. Since pad areas can be made large by an amount according to the reduction in parasitic capacitance, production stability can be improved.

Moreover, in the case where resin is formed on the laser structure 10, stress occurs in the resin due to the difference between the linear expansion coefficients thereof, and the resin may be delaminated or cracked. However, in the laser diode according to embodiment 1 of the present invention, providing the hollow portions 15 reduces the contact areas between the supporting portions 13 made of resin and the laser structure 10. Accordingly, internal stress in the supporting portions 13 can be reduced, and the supporting portions 13 can be prevented from being delaminated and cracked.

With the laser diode manufacturing method according to embodiment 1 of the present invention, the hollow portions 15 can be ensured. This will be described below. As described previously, since resist for patterning the metal layer 18 is used in a state in which the hollow portions 15 are sealed with the ceiling portion 16, the buried portions 30, and the laser structure 10, resist can be prevented from entering the hollow portions 15. Accordingly, the hollow portions 15 can be ensured.

The laser diode according to embodiment 1 of the present invention and the method of manufacturing the laser diode can be variously modified within a range in which features thereof are not lost. For example, to ensure the hollow portions 15 while providing the supporting portions 13, each of the supporting portions 13 needs to be separated from at least one of the adjacent side surface of the ridge portion 10a and the side surface of the adjacent terrace portion 10c. In other words, the supporting portion 13 may contact the side surface of the ridge portion 10a or the side surface of the terrace portion 10c. If the supporting portion 13 contacts the terrace portion 10c, the third portion 16c of the ceiling portion 16 connects to the first portion 16a, not the second portion 16b. The third portion 16c connects to the first portion 16a or the second portion 16b, depending on the position of the supporting portion 13.

The insulating films 12, 14, and 17 of this laser diode are formed to improve adhesiveness between layers and the moisture resistance of the semiconductor laser. The presence or absence and the shape of each of these insulating films can be appropriately changed. For example, the insulating films 14 and 17 may be omitted.

Each of the insulating films 12, 14, and 17 needs to have an opening over the ridge portion 10a. All the openings of the insulating films 12, 14, and 17 may be formed at the same time after the insulating film 17 is formed. Forming all the openings of the insulating films 12, 14, and 17 at the same time shortens the process compared that for the case where the openings of the insulating films 12, 14, and 17 are formed different steps, respectively.

Both or one of the supporting portion 13 and the ceiling portion 16 may be made of non-photosensitive resin. In that case, for example, first, non-photosensitive resin is formed in a shape such as the shape of the precursor 13A in FIG. 3. Then, overall etch back is performed on the resin by dry etching to match the surface of the resin with the surfaces of the ridge portion 10a and the terrace portions 10c. After that, a hard mask made of an insulating film and resist are formed, and resin in the channel portions 10b is patterned by dry etching to form the supporting portions 13. To form an opening in the ceiling portion 16 so that the upper surface of the ridge portion 10a may be exposed, a hard mask made of an insulating film and resist are formed over the ceiling portion 16, and dry etching is performed. Using non-photosensitive resin has the advantage that the amount of outgassing from resin material during curing is small.

To ensure the hollow portions 15, the hollow portions 15 need to be sealed when the metal layer 18 is patterned using resist. The shapes of the supporting portions 13 and the ceiling portion 16 made of resin can be appropriately changed as long as the hollow portions 15 can be sealed with resin material and the laser structure 10. These modifications can also be appropriately applied to laser diodes and laser diode manufacturing methods according to embodiments below.

It should be noted that the laser diodes and the laser diode manufacturing methods according to the embodiments below have many things in common with those of embodiment 1, and therefore differences from embodiment 1 will be mainly described.

Embodiment 2

Figure 13:
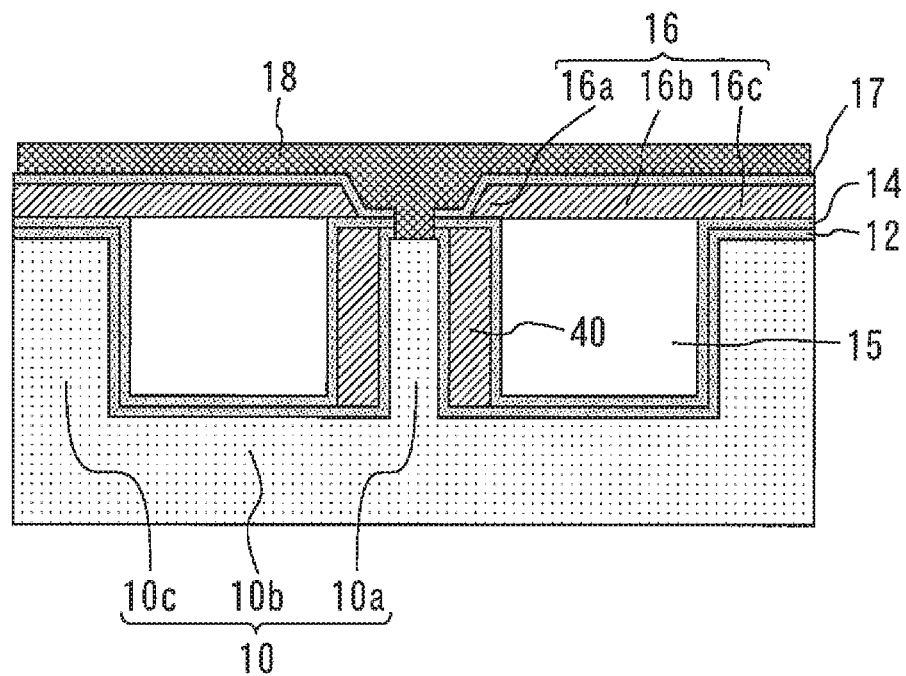
FIG. 13 is a cross-sectional view of a laser diode according to embodiment 2.

FIG. 13 is a cross-sectional view of a laser diode according to embodiment 2. In the laser diode according to embodiment 2, supporting portions 40 contact side surfaces of the ridge portion 10a. The ceiling portion 16 is supported by the supporting portions 40 and the terrace portions 10c. Since the supporting portions 40 contact both sides of the ridge portion 10a, the width of the ridge structure becomes large compared to that of embodiment 1.

Figure 2:
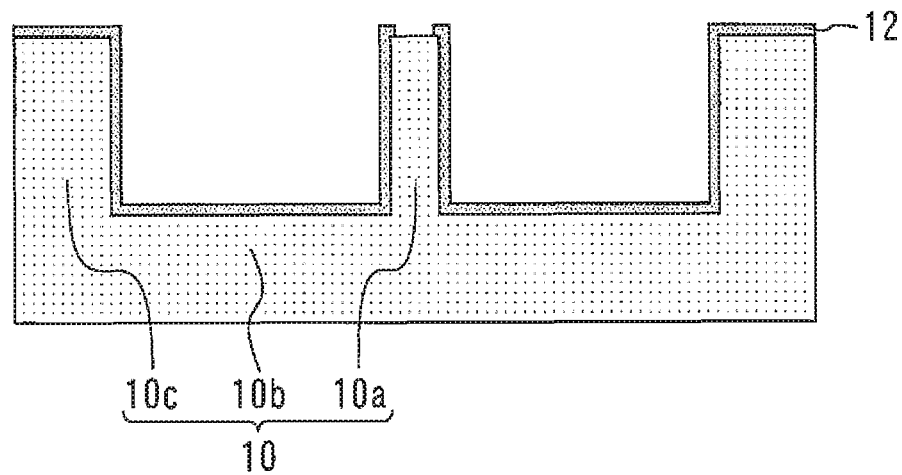
Figure 14:
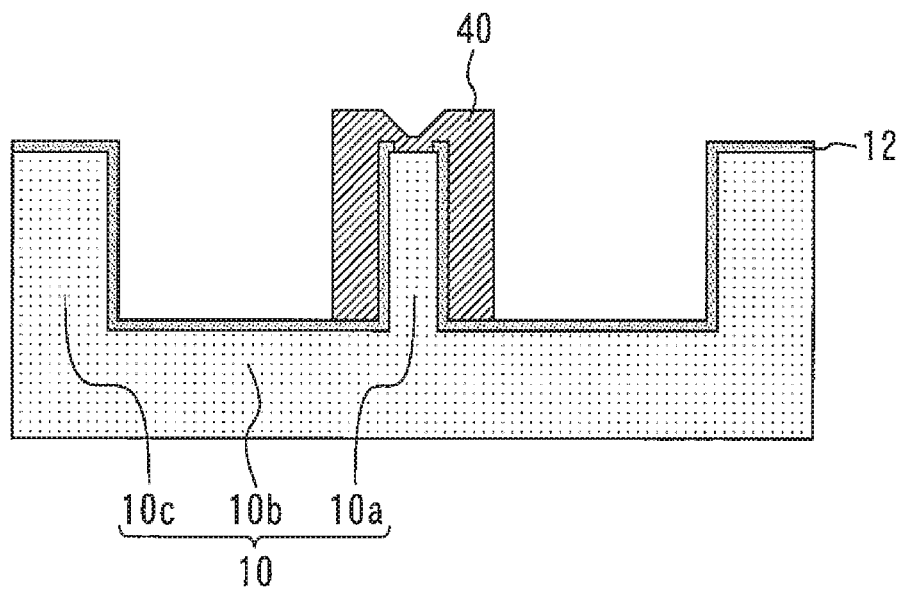

A laser diode manufacturing method according to embodiment 2 of the present invention will be described. First, as shown in FIGS. 2 and 3, the insulating film 12 is formed, and the precursor 13A of photosensitive resin is applied. Subsequently, the precursor 13A is patterned to form the supporting portions 40. FIG. 14, which is a cross-sectional view, shows the supporting portions 40. The precursor 13A is patterned by exposure and development to form the supporting portions 40 contacting the ridge portion 10a. In the case where the ridge width is smaller than the minimum pattern width, i.e., resolution, of the precursor, a resin film having a small thickness is left over the ridge portion 10a. This thin resin film can be removed by light ashing.

Figure 15:
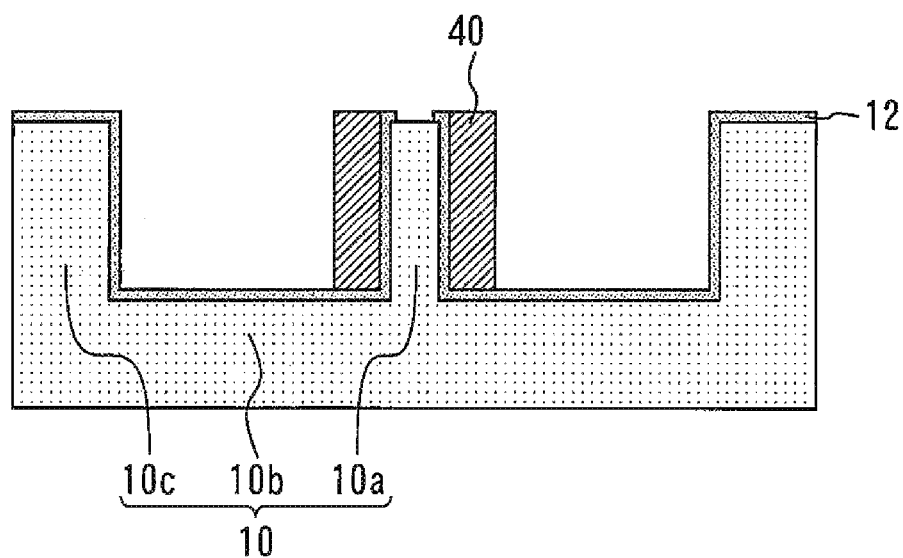

Subsequently, curing is performed to harden the supporting portions 40. FIG. 15, which is a cross-sectional view, shows the supporting portions 40 hardened by curing. Resin material which is shrunk by curing is selected as material for the precursor 13A, and the supporting portions 40 are shrunk by curing so that the supporting portions 40 and the ridge portion 10a may have approximately equal heights.

Figure 16:
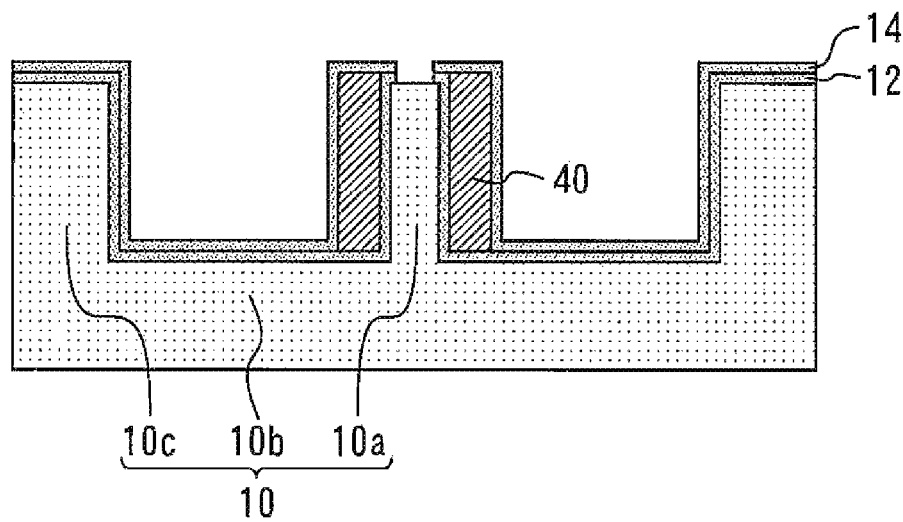
Figure 17:
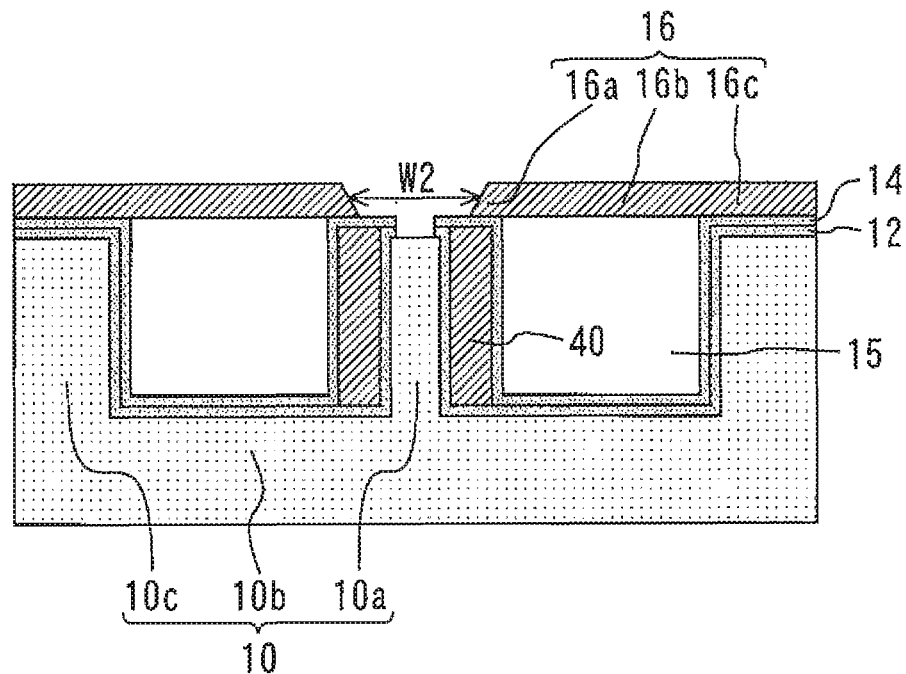

Then, an insulating film is formed. FIG. 16, which is a cross-sectional view, shows a state in which the insulating film 14 is formed. The insulating film 14 covers the laser structure 10 and the supporting portions 40. The insulating film 14 has an opening over the ridge portion 10a. Subsequently, as in embodiment 1, a sheet film having resin formed thereon is joined to the upper surfaces of the ridge portion 10a, the supporting portions 40, and the terrace portions 10c using laminating or STP. FIG. 17 shows the ceiling portion 16. Thus, the hollow portions 15 sealed with the laser structure 10 and resin are formed by forming the supporting portions 40 of resin material in portions of the channel portions 10b and forming the ceiling portion 16 over the supporting portions 40. The ceiling portion 16 serves as a ceiling of the hollow portions 15.

The ceiling portion 16 is patterned by exposure and development to form an opening over the ridge portion 10a. After that, curing is performed on the ceiling portion 16. Since the supporting portions 40 contact the ridge portion 10a, an opening width W2 of the ceiling portion 16 can be made large. Meanwhile, in embodiment 1, since the supporting portions 13 are separated from the ridge portion 10a, the ceiling portion 16 needs to be supported by the ridge portion 10a. Accordingly, the opening width W2 in FIG. 17 can be made larger than the opening width W1 of the ceiling portion 16 shown in FIG. 8.

Figure 18:
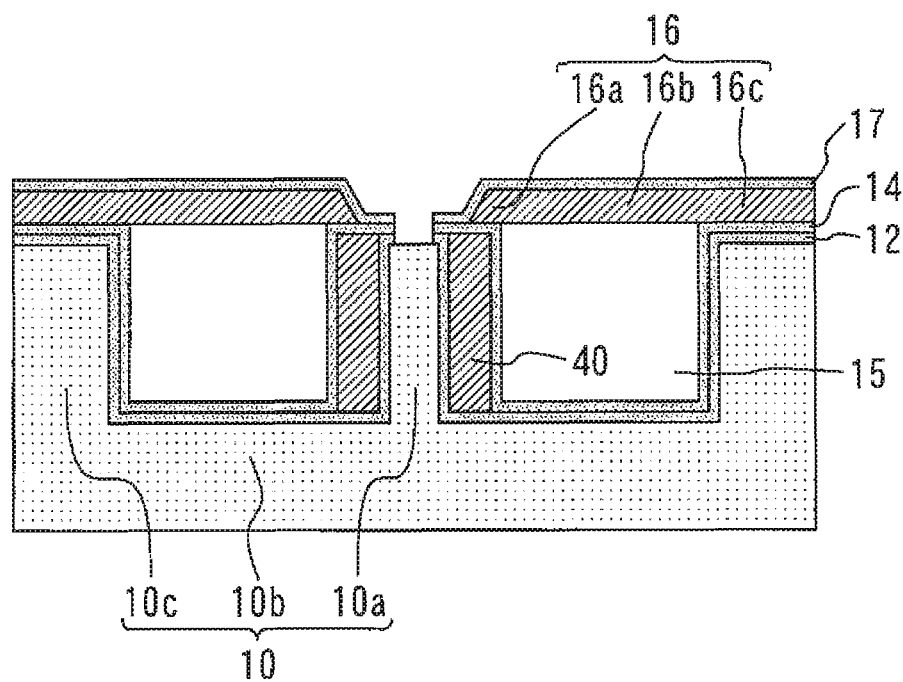

After that, an insulating film is formed on the ceiling portion 16. FIG. 18, which is a cross-sectional view, shows the insulating film 17. The insulating film 17 on the ridge portion 10a is removed. Then, the metal layer 18 contacting the upper surface of the ridge portion 10a is formed over the ceiling portion 16. The metal layer 18 is patterned using resist to form pad electrodes having predetermined shapes over the terrace portion 10c. Thus, the laser diode including the metal layer 18 shown in FIG. 13 is completed. It should be noted that forming the buried portions 30 in addition to the supporting portions 40 and the ceiling portion 16 as resin and supporting the ceiling portion 16 with the supporting portions 13 and the buried portions 30 are the same as in embodiment 1.

In the case where the width of the ridge portion 10a is as small as, for example, 2 μm or less, there is a concern that the ridge portion 10a will be broken when a sheet film is attached to the ridge portion 10a to form the ceiling portion 16. However, in the laser diode according to embodiment 2 of the present invention, since the supporting portions 40 contact the ridge portion 10a, the supporting portions 40 reinforce the ridge portion 10a and improve the strength of the ridge portion 10a. Accordingly, the ridge portion 10a can be prevented from being broken.

In embodiment 1, both the "portions supporting the ceiling portion 16" and the "opening of the ceiling portion 16" need to be formed on the ridge portion 10a. For this reason, in the case where the minimum width of the patterning of the photosensitive resin film by exposure and development is larger than the ridge width, it is impossible to provide both the "portions supporting the ceiling portion 16" and the "opening of the ceiling portion 16" on the ridge portion 10a. In other words, the hollow portions 15 cannot be formed. Even in the case where the minimum width of the patterning of the photosensitive resin film by exposure and development is smaller than the width of the ridge portion 10a, a portion "supporting the ceiling portion" having a certain size needs to be ensured. Accordingly, it is difficult to ensure process stability.

In view of this, in embodiment 2 of the present invention, the supporting portions 40 are brought in contact with the side surfaces of the ridge portion 10a with an insulating film interposed therebetween to form a ridge structure having a large width with the ridge portion 10a and the supporting portions 40. Thus, the "portions supporting the ceiling portion 16" and the "opening of the ceiling portion 16" can be provided on the ridge portion 10a and the supporting portions 40, not on only the ridge portion 10a. Accordingly, since the "portion supporting the ceiling portion 16" and the "opening of the ceiling portion 16" can be provided in a sufficiently wide place, the process can be stabilized.

As described above, forming a ridge structure having a large width with the ridge portion 10a and the supporting portions 40 makes it possible to increase the opening width W2 of the ceiling portion 16. In the case where the opening width W2 is large, the volume of the metal layer 18 on the ridge portion 10a can be increased to reduce the wiring resistance of the metal layer 18 and improve the gain. Since the ceiling portion 16 is tapered on both sides of the opening of the ceiling portion 16, the volume of the metal layer 18 filling the opening can be increased. In the case where a ceiling portion having a reverse tapered shape in which the opening width is larger in a lower portion than in an upper portion is provided, the ceiling portion 16 can be broken at a step. However, in the case where the ceiling portion 16 having a tapered shape in which the opening width is smaller in a lower portion than in an upper portion is provided as shown in FIG. 17, the ceiling portion 16 can be prevented from being broken at a step.

Further, providing the supporting portions 40 on the side surfaces of the ridge portion 10a prevents the supporting portions 40 from being delaminated. For example, the manufacture of a ridge waveguide structure buried in BCB in which grooves on both sides of a ridge portion are filled with BCB has the problem that in dry etching for forming an opening in a resin layer over the ridge portion, resin may be delaminated from the side surfaces of the ridge portion. However, in embodiment 2 of the present invention, since the ceiling portion 16 is made of photosensitive resin, an opening can be formed in the ceiling portion 16 by exposure, development, and light ashing. Accordingly, the supporting portions 40 can be prevented from being delaminated.

Embodiment 3

Figure 19:
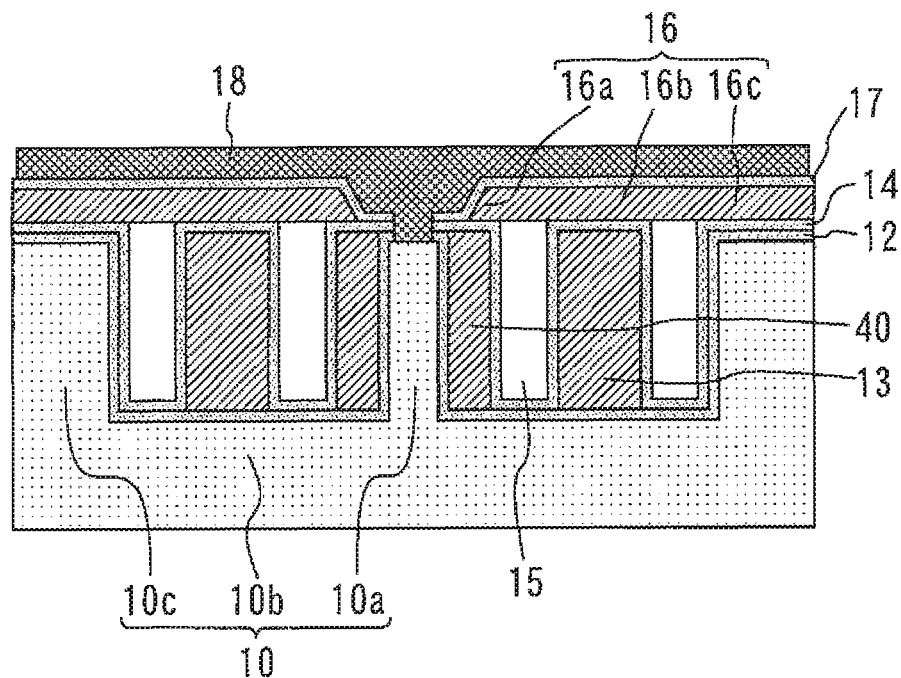
FIG. 19 is a cross-sectional view of a laser diode according to embodiment 3.

FIG. 19 is a cross-sectional view of a laser diode according to embodiment 3. This laser diode includes both the supporting portions 13 shown in FIG. 1 and the supporting portions 40 shown in FIG. 13. Specifically, the supporting portions 40 which are portions contacting the side surfaces of the ridge portion 10a and the supporting portions 13 which are portions contacting neither the side surfaces of the ridge portion 10a nor the side surfaces of the terrace portions 10c are provided as supporting portions.

Figure 20:
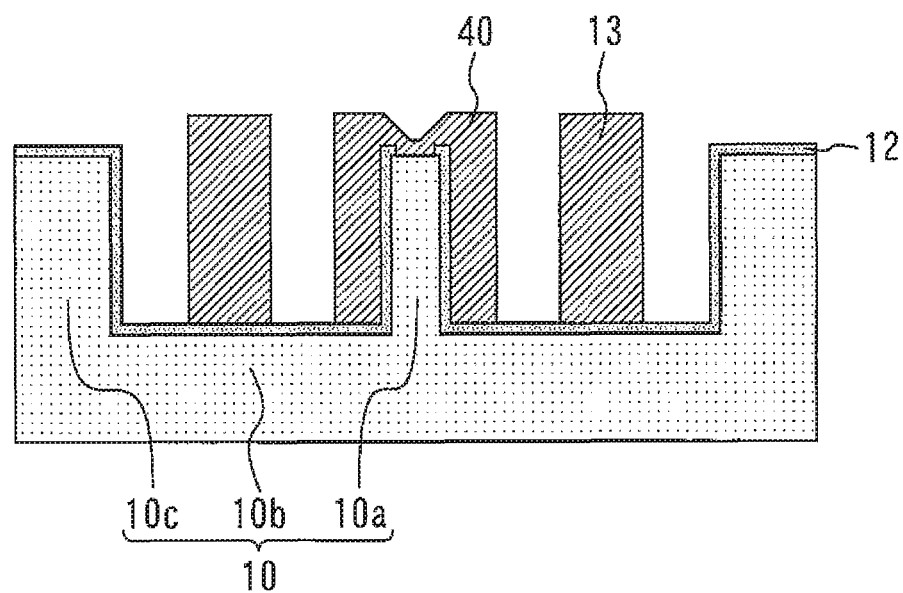
Figure 21:
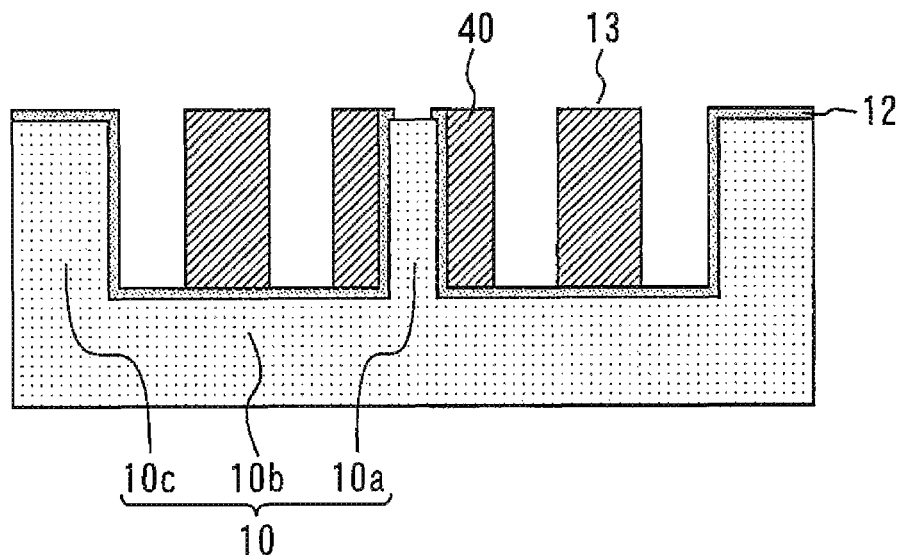

A laser diode manufacturing method according to embodiment 3 will be described. First, as described with reference to FIGS. 2 and 3, the precursor 13A is formed. Subsequently, the precursor 13A is patterned. FIG. 20, which is a cross-sectional view, shows the supporting portions 13 and 40 obtained by patterning the precursor. After that, ashing and curing are performed so that the supporting portions 13 and 40, the buried portions 30, and the ridge portion 10a may have approximately equal heights. FIG. 21, which is a cross-sectional view, shows a state in which ashing and curing have made the heights of the supporting portions 13 and 40 and the ridge portion 10a approximately equal.

Figure 22:
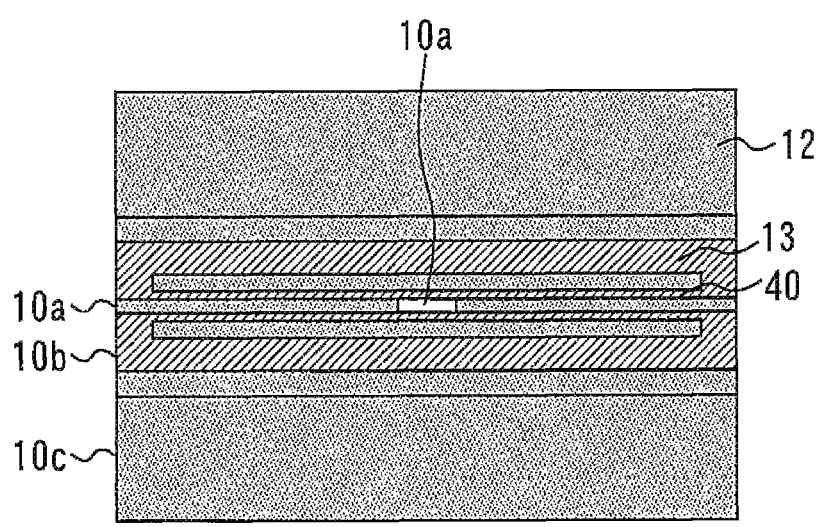

FIG. 22 is a plan view of the laser diode in FIG. 21. The supporting portions 13 and the supporting portions 40 surround portions of the channel portions 10b in planar view. The supporting portions 13 and 40 surround an opening of the insulating film 12 through which the ridge portion 10a is exposed. The supporting portions 13 may be brought into contact with the terrace portions 10c, respectively.

Figure 23:
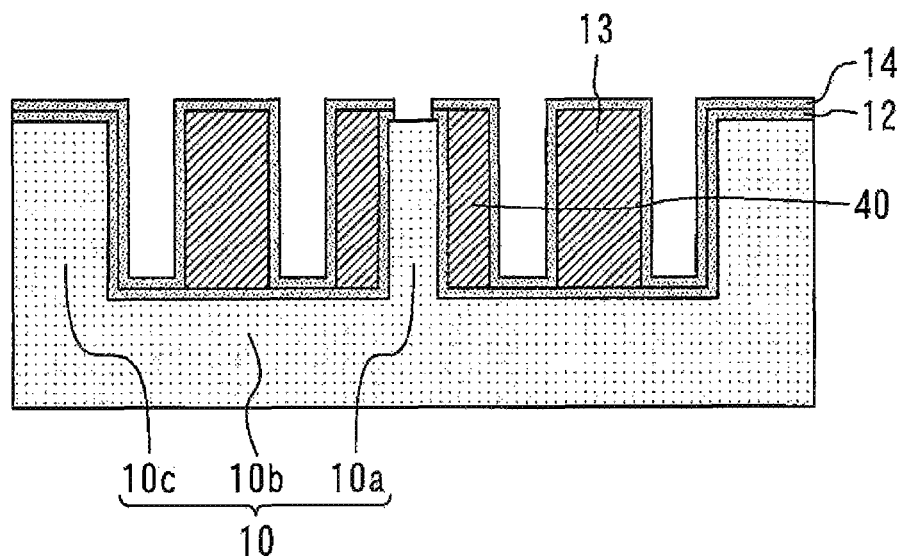
Figure 24:
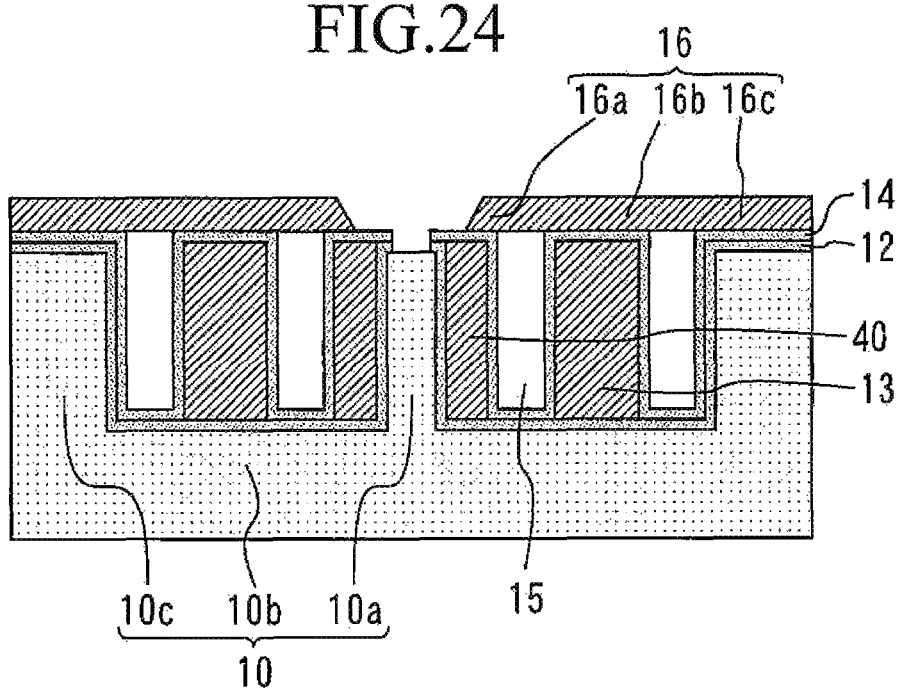

Subsequently, as shown in FIG. 23, which is a cross-sectional view, the insulating film 14 is formed on the laser structure 10 and the supporting portions 13 and 40. Then, as shown in FIG. 24, which is a cross-sectional view, the ceiling portion 16 supported by the supporting portions 13 and 40 and the terrace portions 10c is formed. The ceiling portion 16 seals a space surrounded by the supporting portions 13 and 40. Specifically, the ceiling portion 16 serves as a lid for sealing the hollow portions 15 respectively sandwiched between the supporting portions 13 and the supporting portions 40. It should be noted that in the case where end portions of the supporting portions 13 in FIG. 22 contact the terrace portions 10c, the end portions serve as buried portions, and therefore regions respectively sandwiched between the supporting portions 13 and the terrace portions 10c are also sealed with the ceiling portion 16.

Then, the insulating film 17 and the metal layer 18 are formed. Thus, the laser diode shown in FIG. 19 is completed. Forming the supporting portions 13 and 40 in one laser diode produces both the effects explained in embodiments 1 and 2.

Embodiment 4

Figure 25:
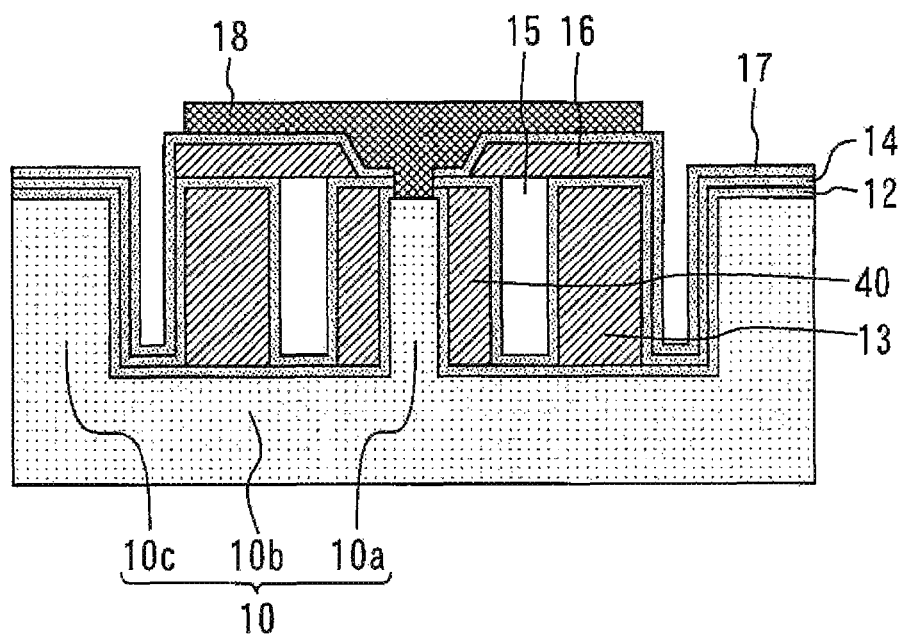
FIG. 25 is a cross-sectional view of a laser diode according to embodiment 4.

FIG. 25 is a cross-sectional view of a laser diode according to embodiment 4. The ceiling portion 16 of this laser diode is provided over the channel portions 10b but not provided over the terrace portions 10c. More specifically, the ceiling portion 16 is supported by the supporting portions 13 and the supporting portions 40 but not supported by the terrace portions 10c. The shapes of the supporting portions 13 and 40 in planar view are the same as those in FIG. 22.

Figure 26:
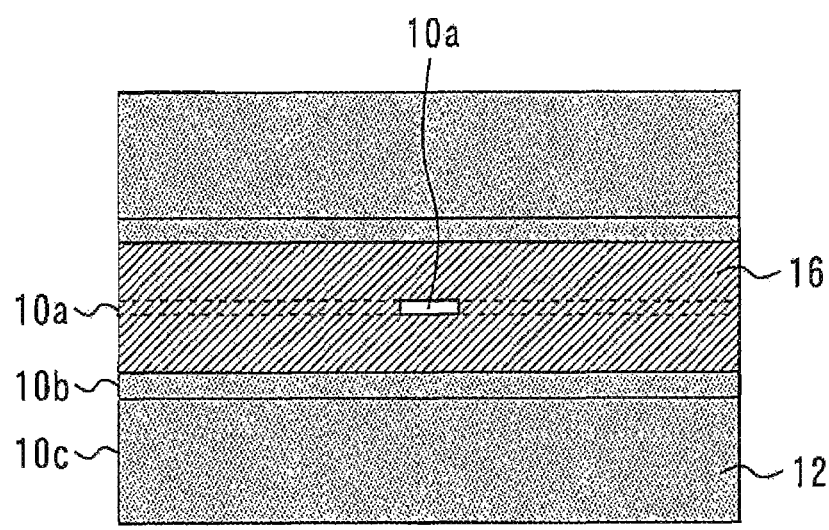
Figure 27:
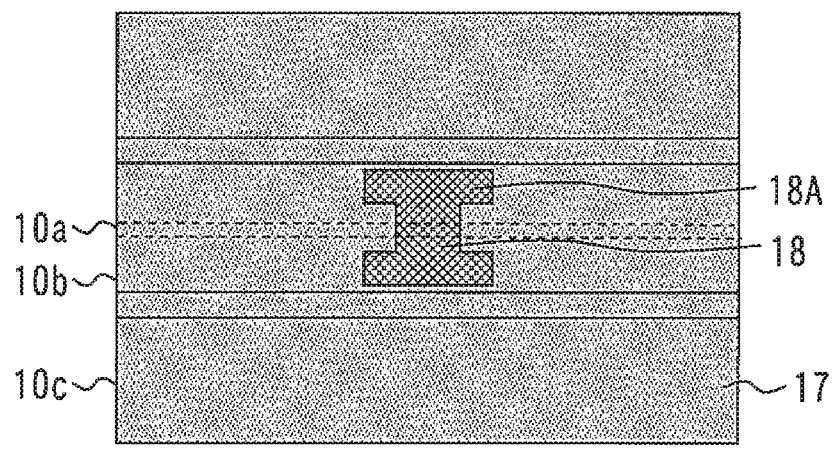

FIG. 26 is a plan view showing the ceiling portion 16 and the like. The ceiling portion 16 is provided over the channel portions 10b and the ridge portion 10a but not provided over the terrace portions 10c. FIG. 27 is a plan view showing the metal layer 18 and the like. The pads 18A, which are portions of the metal layer 18, are provided directly over the supporting portions 13. A capacitance C is expressed by the equation $C=\varepsilon_0\varepsilon_r S/d$ ($\varepsilon_0$: vacuum permittivity, $\varepsilon_r$: relative permittivity, S: area, d: distance). In embodiment 4, since the metal layer 18 is provided only directly over the channel portions 10b and the ridge portion 10a, the area of the metal layer 18 can be made small compared to that in embodiment 1. Accordingly, the capacitance can be made small. A laser diode having a small capacitance is suitable for fast operation.

Figure 28:
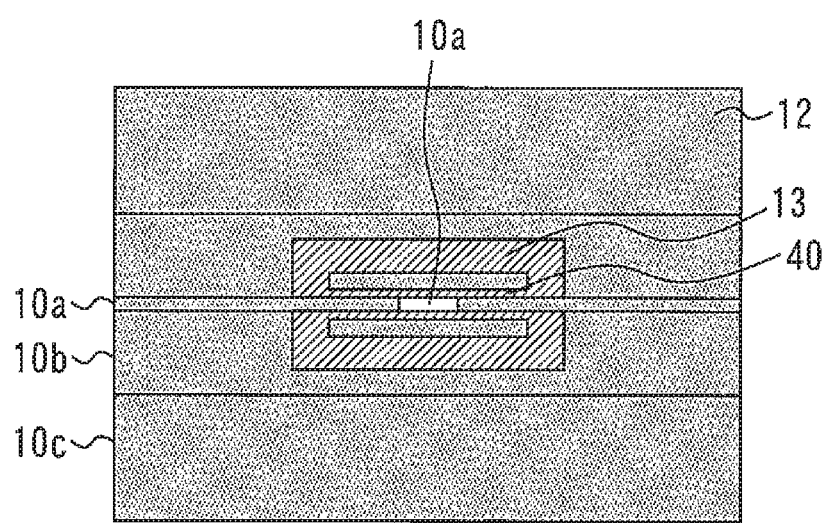

In the case where a small metal layer 18 such as shown in FIG. 27 is provided, the area of the ceiling portion may be smaller than that of the ceiling portion 16 shown in FIG. 26. In the case where a small ceiling portion is provided, a supporting portion for supporting the small ceiling portion can also be made small. For example, FIG. 28 shows the supporting portions 13 and 40 formed to be small. The supporting portions 13 and 40 are formed inward from end faces of the resonator. The lengths of the supporting portions 13 and 40 in the resonator length direction are shorter than the resonator length.

Figure 29:
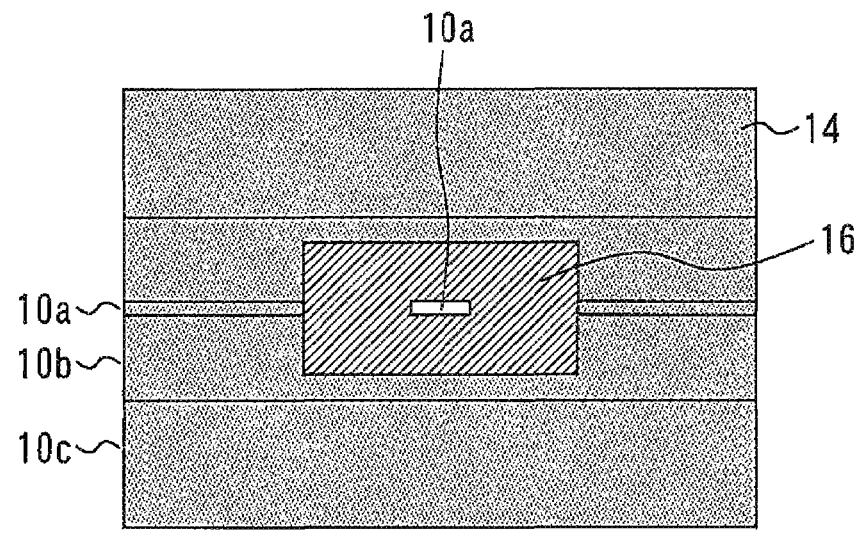
Figure 30:
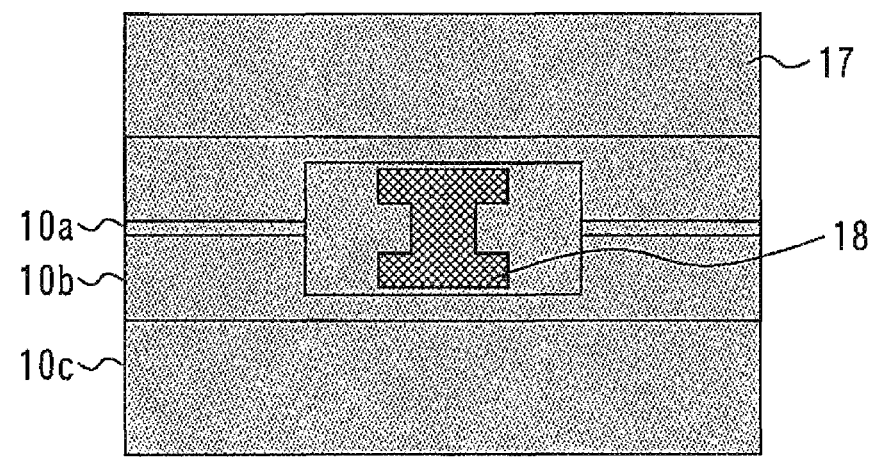

FIG. 29 shows the ceiling portion 16 formed over the supporting portions 13 and 40 in FIG. 28. The ceiling portion 16 in FIG. 29 has a smaller length in the resonator length direction than the ceiling portion 16 in FIG. 26. The ceiling portion 16 in FIG. 29 has a smaller length in the resonator length direction than the resonator length. As shown in FIG. 30, the metal layer 18 is formed on the ceiling portion 16.

Embodiment 5

Figure 31:
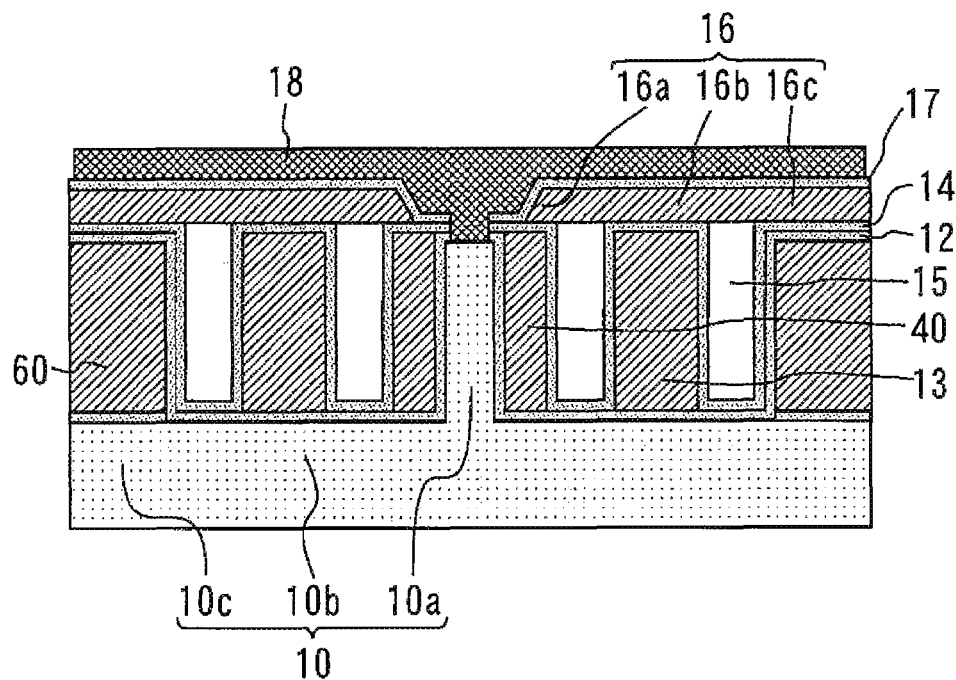
FIG. 31 is a cross-sectional view of a laser diode according to embodiment 5.

FIG. 31 is a cross-sectional view of a laser diode according to embodiment 5. Although the terrace portions 10c are made of a semiconductor in embodiments 1 to 4, the terrace portions 60 of embodiment 5 are made of resin. It is easy to adjust the heights of the terrace portions 60 made of resin. Accordingly, the heights of the ridge portion 10a, the supporting portions 13 and 40, and the terrace portions 60 can easily be made equal.

Embodiment 6

Figure 32:
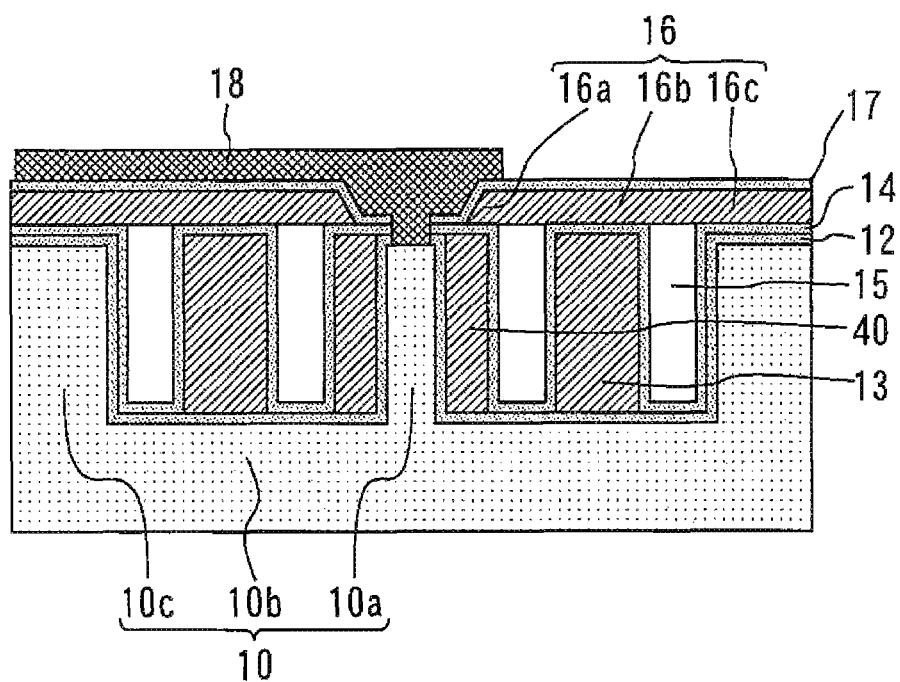
FIG. 32 is a cross-sectional view of a laser diode according to embodiment 6.

FIG. 32 is a cross-sectional view of a laser diode according to embodiment 6. The metal layer 18 exists over one terrace portion 10c of the two terrace portions 10c but does not exist over the other terrace portion 10c. Disposing such wiring made of the metal layer 18 only on one side of the laser diode makes it possible to reduce the parasitic capacitance of the wiring.

A capacitance C is expressed by the equation $C=\varepsilon_0\varepsilon_r S/d$ ($\varepsilon_0$: vacuum permittivity, $\varepsilon_r$: relative permittivity, S: area, d: distance). Since the area of the metal layer 18 of embodiment 6 is half of the area of the metal layer 18 of embodiment 1, the capacitance can be reduced by half. A laser diode having a small capacitance is suitable for fast operation.

Embodiment 7

Figure 33:
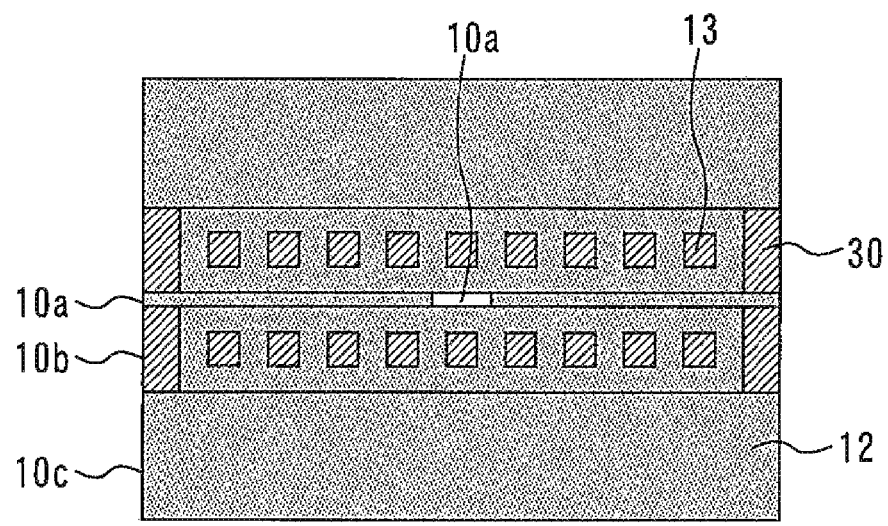
FIG. 33 is a plan view of supporting portions of a laser diode according to embodiment 7.

FIG. 33 is a plan view showing supporting portions and the like of a laser diode according to embodiment 7. A plurality of supporting portions 13 made of photosensitive resin are formed along the resonator length direction. In other words, a plurality of island-shaped supporting portions 13 are provided along the ridge portion 10a. The shapes of the ceiling portion and the metal layer are the same as those of embodiment 1.

Providing the supporting portions 13 in a discontinuous manner in planar view as described above can increase the volume of hollow portions compared to embodiment 1. Accordingly, a laser diode having a small parasitic capacitance can be provided. Moreover, since the volume of the supporting portions 13 made of resin is small compared to that of embodiment 1, the internal stress in the resin is reduced, and the resin can be prevented from being delaminated and cracked.

Figure 34:
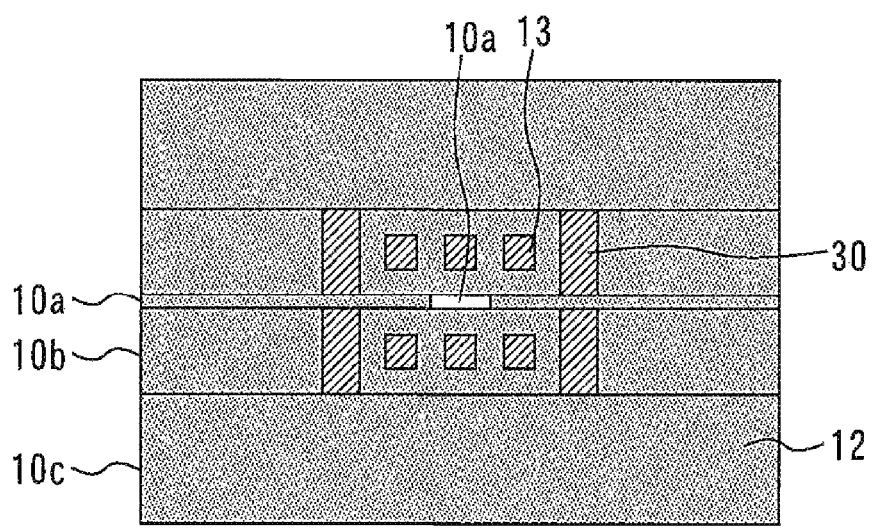
FIG. 34 is a plan view of supporting portions according to a modified example.

FIG. 34 is a view showing a modified example of supporting portions. In FIG. 34, the number of supporting portions 13 is smaller than in FIG. 33, and the buried portions 30 are moved from resonator end faces toward a center of the resonator accordingly. A ceiling portion is formed over the buried portions 30, the supporting portions 13, and the terrace portions 10c to form sealed hollow portions. The length of the ceiling portion is made smaller than the resonator length, and the ceiling portion is supported by the supporting portions or the buried portions.

Embodiment 8

Figure 35:
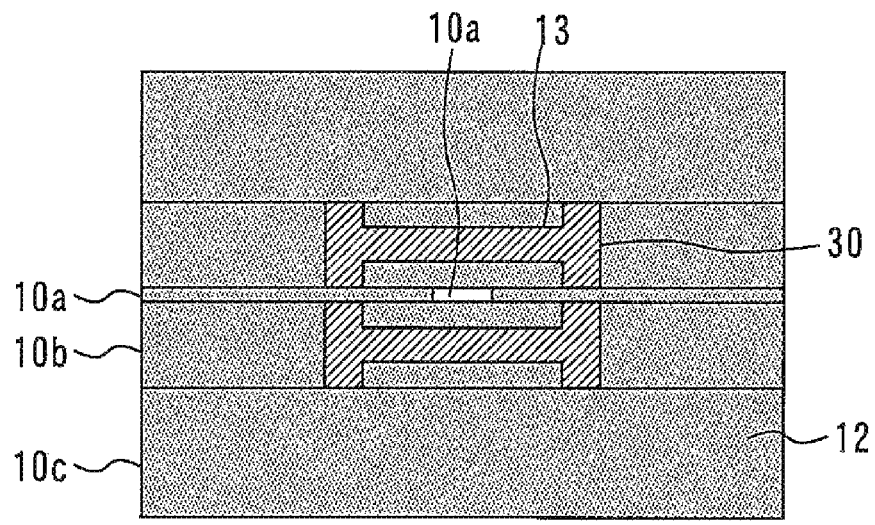
FIG. 35 is a plan view of supporting portions according to embodiment 8.
Figure 36:
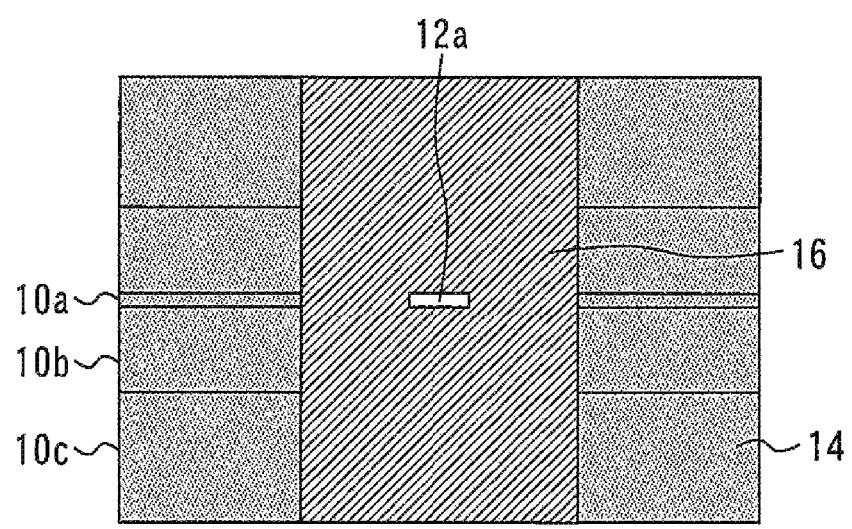

FIG. 35 is a plan view showing supporting portions and the like according to embodiment 8. The buried portions 30 are provided inward from the end faces of the laser diode. FIG. 36 is a view showing the ceiling portion 16 formed over the supporting portions 13, the buried portions 30, and the terrace portions 10c in FIG. 35. In embodiment 1, as described with reference to FIG. 9, the ceiling portion 16 is formed over the entire laser structure. However, in embodiment 8, as shown in FIG. 36, the ceiling portion 16 which is long in the lateral direction of the resonator is formed. In the case where the ceiling portion 16 is made of photosensitive resin, the ceiling portion 16 is patterned by exposure, development, and ashing. Meanwhile, in the case where the ceiling portion 16 is made of non-photosensitive resin, a hard mask made of an insulating film and resist are formed over the ceiling portion 16, and patterning is performed by dry etching.

Figure 37:
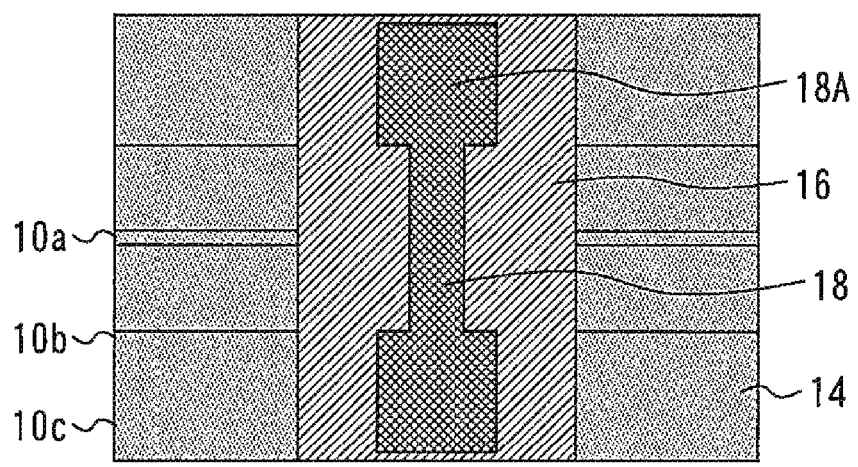

FIG. 37 is a view showing the metal layer 18 formed over the ceiling portion 16. The laser diode according to embodiment 8 is featured by the supporting portions 13 formed in only required regions in accordance with the shape of the metal layer 18. In embodiment 8 of the present invention, the volume of the supporting portions 13 and the ceiling portion 16 made of resin is smaller than that of embodiment 1, and therefore internal stress in the supporting portions 13 and the ceiling portion 16 is reduced. Accordingly, the resin materials of the supporting portions 13 and the ceiling portion 16 can be prevented from being delaminated and cracked. It should be noted that features of the laser diodes and the laser diode manufacturing methods according to the embodiments described above may be appropriately combined.

The present invention has a structure in which a ceiling portion serving as an underlying layer for a metal layer over grooves formed along both sides of a ridge portion is supported by supporting portions provided in the grooves, and therefore can prevent the sagging of the ceiling portion.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a laser diode, comprising the steps of:
    forming resin in portions of channel portions of a laser structure to form hollow portions sealed with the laser structure and the resin, the laser structure including a ridge portion raised in a stripe shape, the channel portions having the ridge portion sandwiched therebetween and being shorter in height than the ridge portion, and terrace portions adjacent to opposite sides of the respective channel portion from the ridge portion and longer in height than the channel portions;
    forming a metal layer contacting an upper surface of the ridge portion over the resin; and
    patterning the metal layer using resist.
2. The method according to claim 1, wherein
    the resin includes supporting portions contacting the respective channel portions and a ceiling portion provided over the supporting portions to serve as a ceiling of the hollow portions, and
    the ceiling portion includes portions provided over the terrace portions, and
    the metal layer is patterned to form pad electrodes over the terrace portions.
3. The method according to claim 1, wherein
    the resin includes:
        supporting portions provided over the respective channel portions and separated from respective adjacent side surfaces of the ridge portion or side surfaces of the respective adjacent terrace portions or both;
        buried portions provided over each of the channel portions to be respectively connected to opposite ends of the corresponding supporting portion in planar view and contact both the adjacent side surface of the ridge portion and the side surface of the adjacent terrace portion; and
        a ceiling portion supported by the supporting portions and the buried portions to serve as a ceiling of the hollow portions.
4. A method of manufacturing a laser diode, comprising the steps of:
    forming supporting portions made of resin in portions of channel portions of a laser structure, the laser structure including a ridge portion raised in a stripe shape, the channel portions having the ridge portion sandwiched therebetween and being shorter in height than the ridge portion, and terrace portions adjacent to opposite sides of the respective channel portion from the ridge portion and longer in height than the channel portions, the supporting portions being separated from respective adjacent side surfaces of the ridge portion or side surfaces of the respective adjacent terrace portions or both;
    forming a ceiling portion supported by the supporting portion and the ridge portion and made of resin by any one of laminating and STP to form hollow portions between the ceiling portion and the channel portions; and
    forming a metal layer contacting an upper surface of the ridge portion over the ceiling portion.
5. The method according to claim 4, wherein the supporting portions contact the respective adjacent side surfaces of the ridge portion.

* * * * *